United States Patent [19]

Swamy

[11] Patent Number: 5,576,519
[45] Date of Patent: Nov. 19, 1996

[54] ANISOTROPIC INTERCONNECT METHODOLOGY FOR COST EFFECTIVE MANUFACTURE OF HIGH DENSITY PRINTED WIRING BOARDS

[75] Inventor: Deepak N. Swamy, Austin, Tex.

[73] Assignee: Dell U.S.A., L.P., Austin, Tex.

[21] Appl. No.: 409,289

[22] Filed: Mar. 23, 1995

Related U.S. Application Data

[62] Division of Ser. No. 177,055, Jan. 4, 1994.

[51] Int. Cl.⁶ .................................................. H05K 1/14
[52] U.S. Cl. .................... 174/265; 174/264; 29/840; 361/790; 361/792; 439/67; 439/65
[58] Field of Search ................................ 174/262, 264, 174/265; 361/790, 792; 439/65, 66, 67, 74, 83; 29/854, 832, 840, 852

[56] References Cited

U.S. PATENT DOCUMENTS

| | | | |
|---|---|---|---|
| 3,569,607 | 3/1971 | Martyak | 174/68.5 |
| 4,249,302 | 2/1981 | Crepeau | 29/830 |
| 4,783,722 | 11/1988 | Osaki et al. | 361/411 |
| 4,858,077 | 8/1989 | Shinohara et al. | 361/414 |
| 5,006,673 | 4/1991 | Freyman | 174/255 |
| 5,157,477 | 10/1992 | Chance | 357/71 |
| 5,296,652 | 3/1994 | Miller, Jr. | 174/265 |
| 5,331,514 | 7/1994 | Kuroda | 361/760 |
| 5,374,196 | 12/1994 | Horine | 439/65 |

*Primary Examiner*—Laura Thomas
*Attorney, Agent, or Firm*—Haynes and Boone, L.L.P.

[57] ABSTRACT

An interconnect sheet for connecting multiple layers of a circuit board for the manufacture of high interconnect density PWBs. The interconnect sheet preferably comprises an area array grid of 0.003 inch solder columns having a 0.006 inch pitch. The interconnect sheet is preferably used to attach two or more multi-layer boards by placing one sheet at every interconnect surface. This interconnect mechanism has an advantage of redundancy of contact and therefore lower susceptibility to failure than other methods. The interconnect sheet of the present invention also offers a large tolerance for registration error without shorting adjacent pads. The preferred method of fabrication of the interconnect sheet begins with creating equally spaced holes through a 0.5 ounce double sided laminate comprising a dielectric sheet and copper plates on either side of the dielectric. These holes are filled with solder paste and the sheet undergoes a baking process to shrink the paste. The remaining copper is then etched away using an alkaline etcher. The solder essentially acts as its own etch resist and thus remains. The solder is then reflowed causing it to ball, thus forming an interconnect sheet comprising a dielectric with a plurality of solder balls arranged throughout the dielectric.

5 Claims, 3 Drawing Sheets

ANISOTROPIC INTERCONNECT METHODOLOGY FOR COST EFFECTIVE MANUFACTURE OF HIGH DENSITY PRINTED WIRING BOARDS

This is a division of application Ser. No. 08/177,055 field Jan. 4, 1994.

FIELD OF THE INVENTION

The present invention relates to the manufacture of high interconnect density printed wiring boards, and more particularly to an interconnect sheet for the attachment of multi-layer boards.

DESCRIPTION OF THE RELATED ART

The computer industry continues to move toward higher speed devices and thus higher density components in the first and second levels of packaging. First level packaging refers to the semiconductor die and its mode of attachment to the second level package. Typical examples of first level packaging include attach modes such as DCA (direct chip attachment), QFP (quad flat pack), PGA (pin grid array), BGA (ball grid array) or COB (chip on board), among others. The second level of packaging refers to the substrates on which the chip is mounted, such as MCM-D (multi-chip module: deposited) or thin film substrates, MCM-C (multi-chip module: co-fired) or multi-layer glass ceramic substrates, and MCM-L (multi-chip module: laminated) or multi-layer printed circuit boards (PCBs) or printed wiring boards (PWBs). This trend toward higher speed, higher I/O density semiconductor devices without any significant increase in body size has necessitated development of technologies for manufacturing high density PCBs.

A printed circuit board typically comprises one or more conductive layers which are sandwiched together. Insulating layers are interspersed between the conductive layers to prevent shorting of the conductive layers. The insulating layer is typically a prepeg material which is comprised of a fiberglass sheet with epoxy embedded within the fiberglass. Other materials include polymide, cynate, Kevlar, Teflon, etc. The prepeg material is used to bind the conductive layers together. Once the desired number of conductive and insulating layers have been created and bound together, it is then necessary to electrically connect the various conductive layers. The method typically used has been to drill holes completely through the layers to create through vias, or partially through the layers to create blind vias, and then to plate these holes with copper or another electrically conductive substance. Copper is deposited into the barrel of the hole, thus electrically connecting desired interconnections in the respective layers.

When plated through holes are thus created, it is mandatory to have holes of sufficient diameter to permit easy flow of the copper plating solution through the holes to allow the deposition process to take place. The ratio of the thickness of the board relative to the diameter of the drilled hole size is referred to as the aspect ratio. While high aspect ratios of 20:1 have been achieved in certain applications, the standard in the industry is 8:1 or 10:1 in the case of high technology PCB fabrication houses. Where the drilled hole diameter becomes too small, i.e., where the aspect ratio is too high, plating solution passage and replenishment within the hole is not possible, leading to discontinuities in the plated interconnection, referred to as opens. This implies, therefore, that a circuit board that is, for example, 80 mm thick must not have a drilled hole that is smaller than 8 mm for it to be manufacturable. The same and perhaps more stringent restrictions apply to blind vias, which are formed when the holes are not drilled through the entire board but terminate internally. In this case as well, the diameter of the hole should be large enough to permit plating solution flow. Blind vias are more sensitive to higher aspect ratios than through vias since the plating solution cannot exit through the bottom of the substrate. Thus, building a high density substrate that meets these fabrication criteria results in the bare board being extremely large to allow for large plated through vias and their pads. This runs counter to the current trend of packaging all electronic applications in ever smaller packages, notwithstanding the associated cost of such a circuit board.

An additional way of increasing interconnect density is to drill vias in the internal layers and plate them prior to stacking these layers together and laminating them. The resultant vias are referred to as buried vias since they are buried internally to the board. The creation of buried vias requires additional process steps that result in added cost to the bare board. Also, the number of fabrication houses that provide this service are very limited.

Therefore, the manufacture of PCBs with high wiring densities has been limited by the above design and cost considerations. Since chip designers require high density compact modules as secondary packaging elements, an improved method and apparatus for high density substrates that maximizes board circuit density without significantly increasing cost is desired.

One common approach has been to break down the high layer count of the desired printed circuit board into less thick boards or subsections which are then placed together and joined by one of various means to yield the final product. Reducing board thickness permits a reduction in through hole sizes without violating the aforementioned criteria on aspect ratio. Thus, the same 80 mm board that required a minimum drilled hole size of no smaller than 8 mm could have a minimum drilled hole size of only 1.6 mm if this board were split into 5 subsections each having a 16 mm thickness and the holes were drilled through these individual subsections. After holes have been drilled through the respective subsections and copper has been deposited into the holes to form the desired interconnections, the subsections are then subsequently joined together by various means to produce the final product. This reduction in through hole size translates into increased density due to increased space on the PCB, previously occupied by through holes, that is now available for wiring.

One product currently available referred to as Z-Link and manufactured by Sheldahl comprises a dielectric with solder particles randomly dispersed throughout the dielectric. One problem with this product is that as the pitch between the contacts on the board sections being connected gets tighter, there is a possibility of both lack of contact and/or contact between adjacent pads, resulting in opens and/or shorts, respectively, between the connections due to the random dispersion of solder particles.

A processing method utilized by Cray Research, Inc. entails utilizing gold spring contacts that are placed in the plated through vias of a subsection and placing the other end of the contact in the corresponding via of the adjacent subsection. One of the primary drawbacks of this method is that it relies on mechanical interconnection, which leads to problems with contact resistance and, therefore, electrically undesirable higher voltage drops when a signal passes through this interconnect medium. In addition, plated through hole tolerances are extremely tight to facilitate proper insertion of these contacts.

Another type of high density interconnect interface was developed by Supercomputer Systems, Inc., a company which has since been acquired by IBM. This interconnect was used to connect subsections having gold plating on the outer layers of the subsections. The interconnect was a double layer board having tin as the outer sheet on each side. The artwork or surface design of each side of the interconnect was identical. The respective outer gold plated layer in each multilayer board being connected had generic artwork or pads, and the tin interconnect had matching pads that had to be aligned with the pads on the board. The tin surfaces of the interconnect sheet were aligned and sandwiched together with the respective gold surfaces of two or more multilayer sections. When subjected to high pressure and temperatures, the resulting solid state diffusion of gold and tin permitted intermetallic diffusion resulting in a homogenous interconnection.

One problem with this method was that this diffusion required very high temperatures, and this in turn required a special dielectric that could stand these high temperatures. Thus a Poly-tetra-fluoro-ethylene (PTFE) based thermoplastic composite was used as the dielectric. This dielectric was very expensive, thus increasing the cost of the PWB. Another problem with this method was that the interconnect was not anisotropic, meaning the tin-based interconnect had to be exactly aligned with the multilayer board. A further problem was the tendency of the tin to oxidize, which resulted in problems in storing the interconnect sheets. The cost of gold plating all of the subsections also increased cost. In addition, the gold and tin thicknesses had to be tightly controlled to prevent formation of an undesirable and more brittle intermetallic that resulted in poor mechanical strength of the joints formed.

SUMMARY OF THE INVENTION

The present invention comprises an interconnect methodology for the manufacture of high interconnect density PWBs that increases the circuit density of the PWB while reducing cost. More particularly, the present invention comprises an interconnect sheet that is used to connect two or more multilayer subsections of a circuit board into a composite multilayer board. The interconnect sheet comprises an area array grid of solder columns, preferably evenly spaced from each other. In the preferred embodiment, the interconnect sheet comprises a grid of 0.003 inch solder columns having a 0.006 inch pitch. The interconnect sheet is placed at respective interconnect surfaces between double layer or multi-layer board sections to connect the sections together to form a single circuit board, and the package is subjected to a lamination cycle to form the PWB. During the lamination cycle, the solder columns reflow under temperature and pressure thus forming a composite substrate. Prior to connecting the various sections, holes are drilled through the respective multilayer sections so that, when the sections are bound together, the desired blind and/or buried vias are created in the PWB. In this manner, blind and/or buried vias can be created in the PWB without having to drill holes in each individual layer. Also, the holes can have a much smaller diameter than if the holes were drilled through the entire circuit board at one time.

The preferred method of fabrication of the interconnect sheet is as follows. First, a 0.5 ounce double sided laminate is created comprising a dielectric sheet with copper plates on either side of the dielectric. Equally spaced holes are then etched into the copper plate portions of the double-sided laminate using a standard print and etch process. Holes are then laser drilled through the dielectric using the preformed holes in the copper plates. Holes may alternatively be formed by traditional drilling processes. These holes are filled with solder paste and the solvents are baked off. The baking process causes the solder paste to shrink, and the shrinkage of the paste approximately equals the thickness of the copper. The remaining copper is then etched away using an alkaline etcher. The solder essentially acts as its own etch resist and thus remains unaffected by the etchant. The solder is then reflowed causing it to ball, thus forming an interconnect sheet comprising a dielectric with a plurality of solder balls arranged throughout the dielectric.

The interconnect sheet according to the present invention allows the construction of a low cost PWB while maximizing circuit density. This method of construction further allows for the testability of the individual modules that comprise the final PWB prior to the lamination step, thereby enhancing final product yield.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
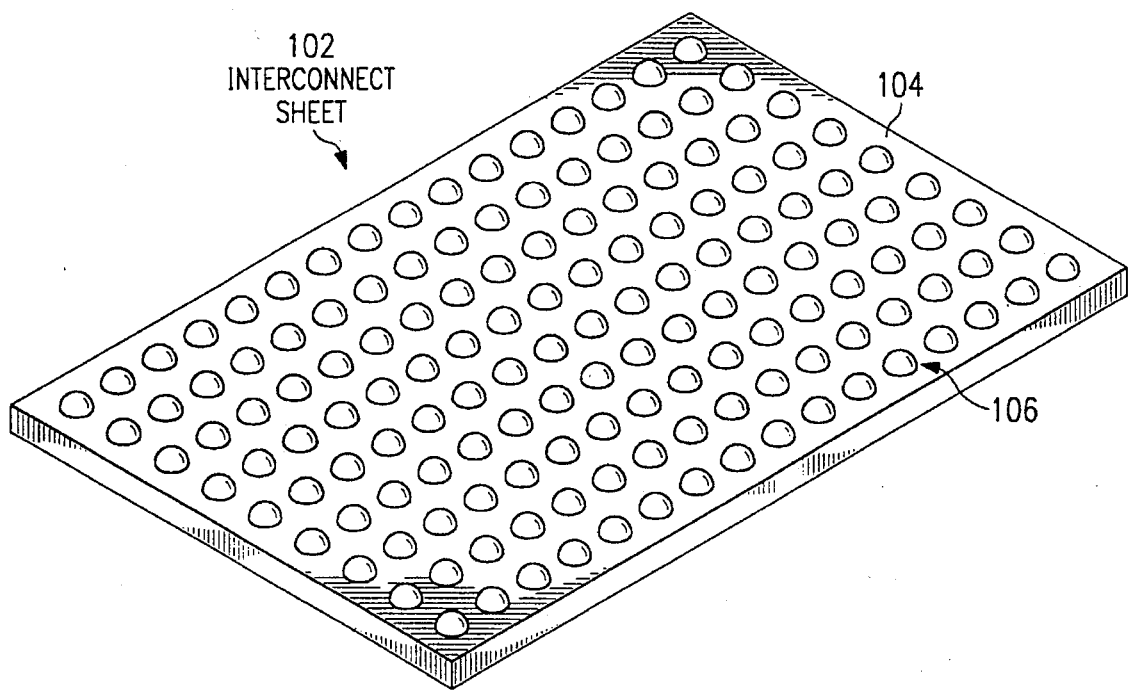
FIG. 1 illustrates an interconnect sheet according to the preferred embodiment of the present invention.

Referring now to FIG. 1, an interconnect sheet 102 according to the preferred embodiment of the present invention is shown. The interconnect sheet 102 comprises a dielectric sheet 104 with an area array grid of solder columns 106 as shown. The solder columns 106 are organized in a grid with preferably equal spacing between each column. In the preferred embodiment, the interconnect sheet comprises a grid of 0.003 inch solder columns having a 0.006 inch pitch. However, it is noted that other types of configurations are also contemplated. The interconnect sheet 102 is preferably used to attach two layer or multi-layer sections of a board together by placing the sheet at the respective interconnect surface between the two sections.

Figure 2:
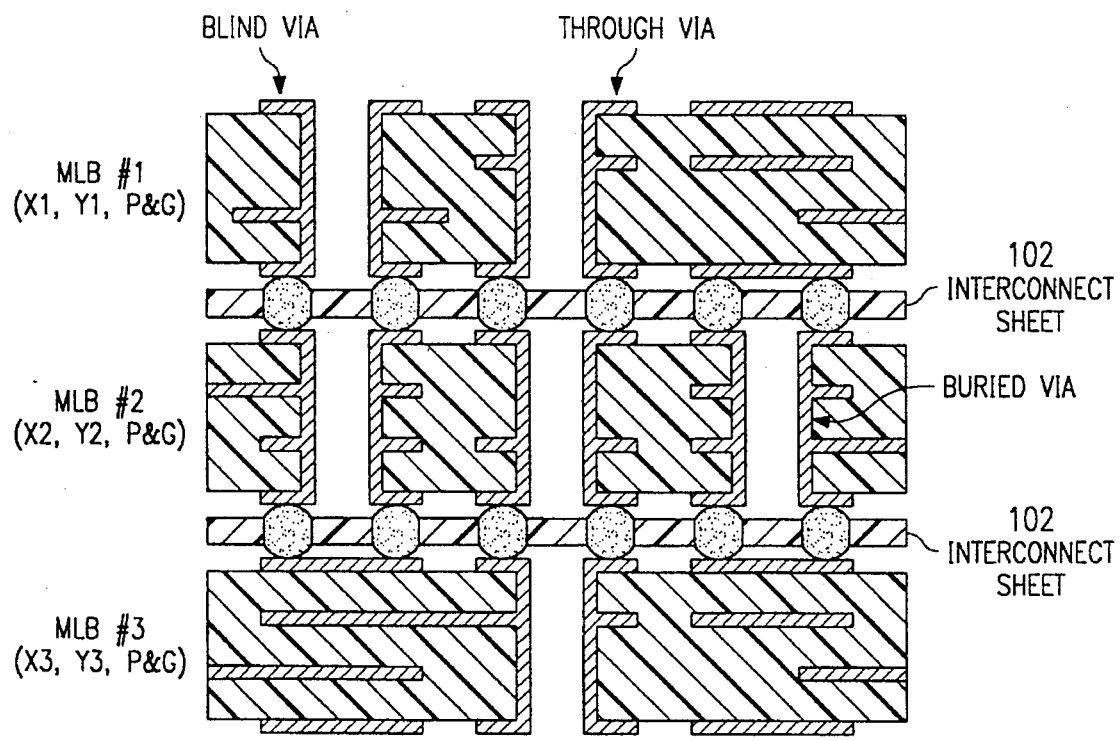
FIG. 2 illustrates a cross-sectional view of a circuit board manufactured using the interconnect sheet according to the present invention.

Referring now to FIG. 2, a diagram illustrating use of the interconnect sheet 102 of the present invention to connect several multi-layer sections to form a printed wiring board is shown. As shown, the printed wiring board includes three multi-layer board sections referred to as MLB #1, MLB #2, and MLB #3. Each multilayer board section includes four conductive layers comprising X and Y signal layers, a power plane, and a ground plane. The power and ground planes are preferably on the outer layers of the multilayer board section. A first interconnect sheet 102 is used to connect MLB #1 and MLB #2 and a second interconnect sheet 102 is used to connect MLB #2 and MLB #3. The multilayer board sections are connected such that the ground planes on two sections are connected and the power planes of two sections are connected. As shown, the printed wiring board may include one or more buried vias, blind vias and through vias as desired.

The preferred method for creating a printed wiring board as shown in FIG. 2 is to first fabricate each of the three multi-layer board sections 1, 2, and 3 and drill holes through these respective sections as desired. The holes that are drilled in each section will form plated through, buried, or blind vias in the PWB when the sections are assembled to form the PWB. Since the thickness of any one subsection is less than the thickness of the final board, the diameter of the holes being drilled can be smaller for the same aspect ratio, thus increasing routing space and hence circuit density. These sections are then interconnected using the interconnect sheet of the present invention. It is noted that this method allows for individually testing of each of the subsections prior to their being joined together.

When multi-layer boards are being connected with an interconnect sheet, it is noted that exact placement of the interconnect sheet relative to the respective multi-layer boards is not necessary. In other words, the interconnect can be skewed somewhat relative to the respective multi-layer boards. Since the interconnect sheet has a very tight pitch of solder balls and is generic to all boards, the interconnect sheet does not have to be exactly aligned with either of the respective multi-layer boards. Thus, the interconnect sheet is referred to as anisotropic. However, it is noted that the two multi-layer boards being connected must be properly and exactly aligned for proper operation of the various through holes and proper interconnection of the respective contacts on the boards.

The interconnect sheet of the present invention obviates the necessity of having to drill through each single layer individually to create blind or buried vias, but rather the holes can be drilled through much larger multi-layer sections with the interconnect sheet being used to connect the multilayer sections. This considerably reduces the number of process steps required while still allowing the formation of blind and buried vias in the PWB. More importantly, since subsection thicknesses are smaller, smaller plated through holes can be created with the same aspect ratios, thus freeing up space for additional routing and, hence, increased wiring density.

Thus, the interconnect mechanism can be used with boards having smaller to diameter through holes but yet is still economically and technically more feasible than the prior art methods discussed above. The interconnect mechanism further has an advantage of redundancy of contact and therefore lower susceptibility to failure than other methods. The interconnect sheet of the present invention also offers a large tolerance for registration error without shorting adjacent pads. Therefore, the present invention has reduced cost and complexity compared to prior art methods.

Figure 3:
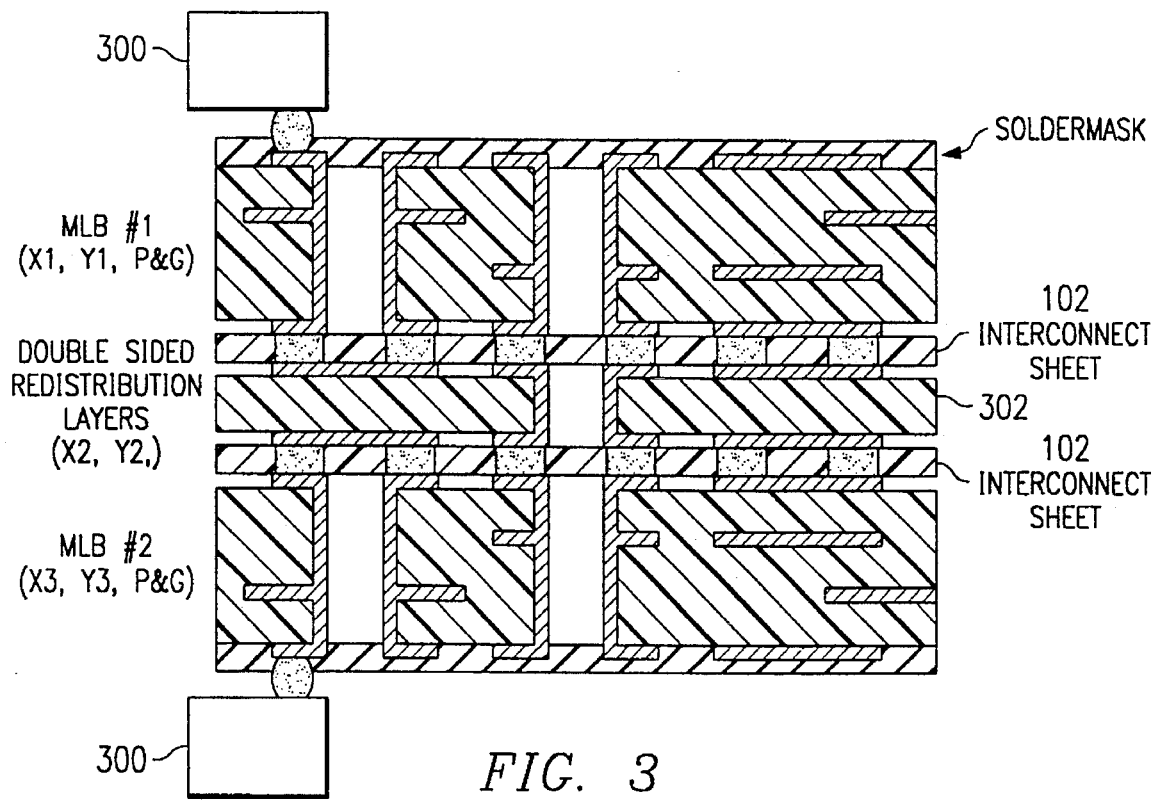
FIG. 3 illustrates a second type of circuit board manufactured using the interconnect sheet according to the present invention.

Referring now to FIG. 3, another application of the present invention is shown. FIG. 3 illustrates a high performance portable package with high I/O density devices 300 attached on both sides of the packages using either BGA or C4 technology. As shown, a double-sided layer 302 is connected between opposing faces of two interconnect sheets 102. The other face of each of the respective interconnect sheets 102 connect to multi-layer boards referred to as MLB #1 and MLB #2. The double-sided board 302 comprised in the center of the PWB routes signals between the two multilayer sections MLB#1 and MLB #2. The double sided board 302 is utilized as a redistribution layer, i.e., the board 302 is used to redistribute signals from high density areas of one multilayer section to a low density areas of another multilayer section. It is noted that any plated through hole (PTH) on the redistribution layer that is terminated at both ends is effectively a buried via within the PWB.

Figure 4:
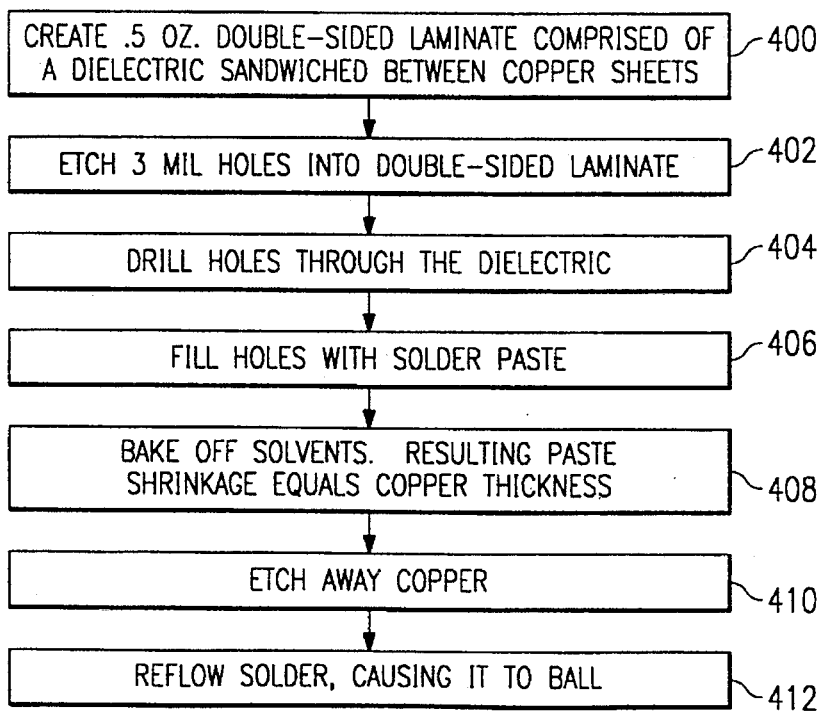
FIG. 4 is a flowchart diagram illustrating a method of fabrication of the interconnect sheet according to the preferred embodiment of the invention.
Figure 5A:
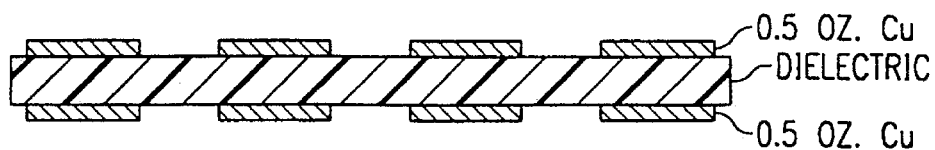
FIGS. 5A–F illustrate various steps in the fabrication method illustrated in FIG. 4.
Figure 5B:

Referring now to FIG. 4, a flowchart diagram illustrating a preferred method of fabrication of an interconnect sheet is shown. FIG. 5 illustrates operation of the method illustrated in FIG. 4, and FIGS. 4 and 5 are explained together for clarity. In step 400 a double-sided laminate is created (or obtained) comprising a dielectric sheet and 0.5 oz. copper foil on either side of the dielectric. The copper foil is present for bonding purposes when solder is added later in the process, as described below. It is noted that other materials may of course be used instead of copper. In step 402 equally spaced holes are etched into the copper foil portion of the double-side laminate using a standard print and etch process. The result of this step is illustrated FIG. 5A. In step 404 holes are laser drilled through the dielectric using the preformed holes formed in the copper foil in step 402. The result of this step is illustrated in FIG. 5B. It is noted that the holes through the double-sided laminate illustrated in FIG. 5B may be created in ways other than that described in steps 402 and 404 as desired.

Figure 5C:
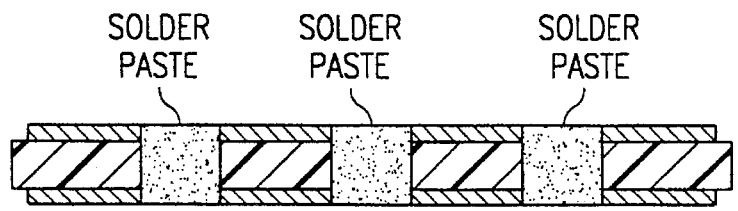

In step 406 these holes are filled with solder paste, and the result of this step is illustrated in FIG. 5C. The solder paste bonds to the copper on the double-sided laminate. As mentioned above, the copper foil is used for this purpose since solder paste generally will not bond to most dielectrics. However, in an alternate embodiment, the method begins with only a dielectric, holes are drilled into the dielectric, and solder paste is applied to these holes in the dielectric. The solder is then caused to ball, preferably using a reflow process, to form the interconnect sheet.

Figure 5D:
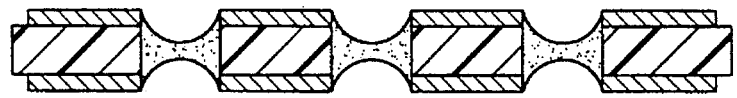
Figure 5E:
Figure 5F:
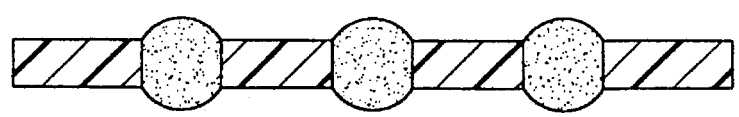

In step 408, solvents are baked off from the solder paste. It is noted that baking the double sided laminate to remove solvents results in the shrinkage of the paste that equals the thickness of the copper, as illustrated in FIG. 5D. In step 410 the remaining copper is than etched away, preferably using an alkaline etcher, whereby the solder is unaffected by the etchant. The result of this step is illustrated in FIG. 5E. The laminate is then subjected to a reflow process in step 412, preferably either vapor phase reflow or infrared reflow. The reflow process causes the solder paste to ball up, thus forming a plurality of solder balls within the dielectric. It is noted that other processes which cause the solder to ball up may also be used. The result is an interconnect sheet comprising a dielectric with a plurality of solder balls arranged throughout the dielectric. A side view of the interconnect sheet resulting from this process is illustrated in FIG. 5F. A perspective view of the interconnect sheet developed by this process is illustrated in FIG. 1.

Therefore an interconnect sheet and a method for making the interconnect sheet is disclosed. The interconnect mechanism can be used with boards having smaller diameter through holes but yet is still economically feasible. The interconnect mechanism further has an advantage of redundancy of contact and therefore lower susceptibility to failure than other methods. The interconnect sheet of the present invention also offers a large tolerance for registration error without shorting adjacent pads.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. An interconnect sheet for connecting circuit layers in printed wiring boards comprising through holes spaced to a first pitch, the interconnect sheet comprising:

a dielectric; and an area grid of solder columns comprised in said dielectric;

wherein the solder columns of the grid have a second pitch which is less than the first pitch, thereby making the interconnect sheet anisotropic.

2. The interconnect sheet of claim 1, wherein said solder columns are approximately equally spaced apart from each other.

3. The interconnect sheet of claim 2, wherein said area array grid of solder columns comprises a grid of approximately 0.003 inch solder columns having approximately a 0.006 inch pitch.

4. A printed wiring board comprising:

a first printed wiring board subsection having through holes spaced at a first pitch;

a second printed wiring board subsection having through holes spaced at a second pitch; and an interconnect sheet comprising a dielectric and an area array grid of solder columns spaced at a third pitch;

wherein the third pitch is less than the first pitch and the second pitch; and wherein the interconnect sheet is disposed between the first and second printed wiring board subsections and thereby connects circuit layers in the first and second printed wiring board subsections irrespective of the interconnect sheet's alignment with the printed wiring board subsections.

5. A method for creating a printed circuit board comprising the steps of:

constructing a first printed circuit board subsection with a first through hole pitch;

constructing a second printed circuit board subsection with a second through hole pitch; and placing an interconnect sheet comprising a dielectric and an area array grid of solder columns spaced at a third pitch in between the first and second printed circuit board subsections;

wherein the third pitch is less than the first pitch and the second pitch; and wherein the pitch of the solder columns prevents misalignment of the interconnect sheet with respect to the first and second printed circuit board subsections.

* * * * *